United States Patent [19]
Oikari et al.

[11] Patent Number: 6,043,508
[45] Date of Patent: Mar. 28, 2000

[54] PHOTODETECTOR INVOLVING A MOSFET HAVING A FLOATING GATE

[75] Inventors: Timo Oikari, Turku, Finland; Jukka Kahilainen, Leechburg, Pa.; Jukka Haaslahti, Turku, Finland

[73] Assignee: Rados Technology Oy, Turku, Finland

[21] Appl. No.: 08/981,724

[22] PCT Filed: Jun. 28, 1996

[86] PCT No.: PCT/FI96/00380
 § 371 Date: May 5, 1998
 § 102(e) Date: May 5, 1998

[87] PCT Pub. No.: WO97/02609
 PCT Pub. Date: Jan. 23, 1997

[30] Foreign Application Priority Data

Jun. 30, 1995 [FI] Finland ................................. 953240

[51] Int. Cl.[7] .................................................. H01L 29/06
[52] U.S. Cl. ............................ 257/10; 257/433; 257/434; 257/462
[58] Field of Search .............................. 257/10, 290, 433, 257/434, 432, 462; 250/214 VT; 313/542

[56] References Cited

U.S. PATENT DOCUMENTS 5,471,051  11/1995  Niigaki et al. ............................ 257/11
5,804,833   9/1998  Stettner et al. ........................... 257/10

Primary Examiner—Minh Loan Tran
Attorney, Agent, or Firm—Kubovcik & Kubovcik

[57] ABSTRACT

A photodetector comprising a photoemissive surface capable of liberating photoelectrons. Photoelectrons are detected by a MOSFET having a floating gate, which is suitably charged before measurement in such a way that photoelectrons can cause a change in charge of the floating gate. The detected change indicates the amount of light received by the detector.

12 Claims, 2 Drawing Sheets

PHOTODETECTOR INVOLVING A MOSFET HAVING A FLOATING GATE

BACKGROUND

Measurement of weak light levels is a common procedure in science and technology.

One of the most sensitive photodetectors is a photomultiplier tube (PMT), or just photomultiplier. The basic structure of this device is a vacuum tube containing a light sensitive photocathode and an electron multiplier structure. Electric field by a high voltage is applied over the system. Photons to be detected hit the photocathode from which they liberate photoelectrons by a photoemission process. The electron multiplier consists of a series (typically 6–16) of secondary emission electrodes, called dynodes, with rising electric potential arranged between them. The photoelectrons from the cathode are directed to the first dynode where they produce several secondary electrons which are, in turn, directed to the next dynode where secondary emission is repeated, and so on. This results in amplification so that the signal from the output electrode, anode, is high enough to be handled electronically. Disadvantages of photomultiplier tubes are relatively high cost and need for high voltage which limit and complicate their versatility.

A different class are various semiconductor photodetectors, e.g. photodiodes, phototransistors and charge coupled devices (CCDs). Common to them is that light is allowed to affect a semiconductor material, where it generates charge carriers (electrons and holes) that are collected to produce an electrical signal. A problem with semiconductor detectors is that the carriers have to migrate in the bulk of semiconductor material where thermal energy produces a high background noise.

SUMMARY OF THE INVENTION

The present invention discloses a new type of photodetector which is cheap, sensitive and easy to construct. It comprises an evacuated chamber containing a photoemissive surface capable of liberating electrons (photoelectrons) through photoelectric effect in response to light photons. Characteristic to the present invention is that the photoelectrons are detected by a metal oxide semiconductor type of field effect transistor (MOSFET) having a floating gate, the gate being suitably charged before measurement. Photoelectron emission causes a change in gate charge, the change being indicative of the amount of light received by the detector.

According to one embodiment, the photoemissive surface is unattached to the gate, the latter being charged to a positive potential before measurement. The positive charge attracts photoelectrons and directs them to the gate where they neutralize its positive charge leading to a decrease in gate potential, the decrease being indicative of the amount of light received by the detector.

According to another embodiment, the photoemissive surface is processed directly on the floating gate which, in this case, is charged negatively before measurement. The liberated photoelectrons are collected to a separate anode electrode or just to the metal wall of the device casing. This causes an increase in the gate potential, the increase being indicative of the amount of light received by the detector.

During the photoelectron collection phase the presented photodetector does not require any electric power (voltage). Obviously, however, an additional electric field can also be applied, in order to optimize photoelectron collection.

OPERATION PRINCIPLE OF THE INVENTION

It is characteristic of the invention that electrons (photoelectrons) liberated from a photoemissive surface by a photoelectric effect in response to light photons are allowed to affect the surface of the floating gate of a MOSFET (metal oxide semiconductor type of a field effect transistor). The invention is based on measuring the effect of photoelectrons on the charge stored in the capacitance of the floating gate of the MOSFET before measurement.

The photoelectrons are collected by means of the effect of the electric field created by the gate after it has first been charged to a suitable potential. This initial charging is accomplished, for example, by applying the FN tunneling technique.

By measuring the conductivity of the drain-source channel of the MOSFET, the amount of gate charge can be determined without destroying the charge itself. This is analogous to reading out the information stored in an analog EEPROM memory.

DRAWING

The drawing show diagrammatically two possible embodiments of the invention.

DESCRIPTION OF THE PREFERRED EMBODIMENTS

Figure 1:
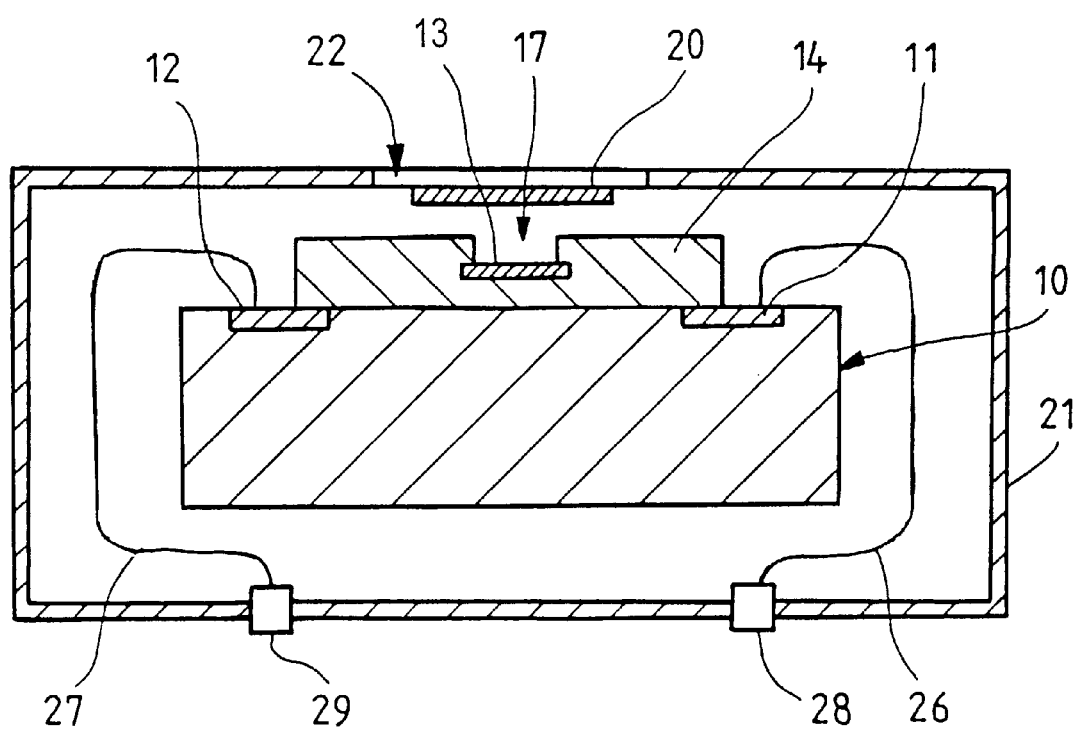
FIG. 1 shows a preferred embodiment.

FIG. 1 shows diagrammatically one embodiment for the photodetector relating to the invention. It should be noted that the elements of figure are not in scale. A photoemissive surface 20 receives light photons and liberates electrons (often called photoelectrons) through a photoelectric effect. Photoemissive materials are previously known and can be the same as those used in photocathodes of photomultipliers.

The photoelectrons are detected by the MOSFET 10. This device has three electrodes: source 11, drain 12 and gate 13. According to the present invention, the gate 13 is kept unconnected, that is, floating. A positive charge is formed beforehand on the gate 13, for example, by applying a sufficiently high voltage between the source 11 and the drain 12. This causes the FN tunneling phenomenon to occur through the oxide layer of the gate insulator 14, causing the potential in the floating gate 13 to be set at the desired charge.

It is known that charge-retention properties of MOSFETs with floating gates are excellent. They are, therefore, well suited for the construction of non-volatile memories, which include both digital and analog EPROM and EEPROM memories. Previously, MOSFETs with charged floating gates have been used as detectors for ionizing radiation, as shown in PCT Publication WO 95/12134.

The positive charge creates an electric field which attracts photoelectrons and directs them to the gate 13. On the surface of the gate 13 there is an uncovered area, or an area covered by a conductor, semiconductor or thin insulator. The thickness of the insulator may not exceed, for example, 1 mm to still enable passage of the electrons through it to the actual gate. Most preferably, however, a part of the surface of the gate is completely uncovered. Accordingly, in the oxide layer insulator 14 of the floating gate 13 a hole 17 has been formed through which the photoelectrons can directly reach the gate 13 surface. When hitting the gate 13, photoelectrons neutralize the positive charge thereon, causing a decrease in the gate 13 potential. The amount of potential decrease in a selected time interval is, therefore, indicative of the amount of light received by the photodetector in that interval.

For proper operation the photoemissive surface 20 and the MOSFET 10 are enclosed in a casing 21 which is evacuated to confine a vacuum. The casing 21 has a transparent portion 22, e.g. of glass, through which light photons can reach the photoemissive surface 20. In the figure there is shown a very useful structure where the photoemissive surface 20 is processed on the interior surface of the transparent portion 22. The photoemissive surface 20 is connected to the metal wall of the casing 21. Obviously, the photoemissive surface can also situate deeper in the interior cavity of the casing.

The gate 13 potential, being proportional to its charge, can be determined by measuring the conductivity of the source-drain channel of the MOSFET 10 without destroying the charge itself. Conductivity is measured by e.g. introducing a suitable voltage between source 11 and drain 12 and by measuring the resulting source-drain current. In other words, the amount of light detected in a selected time interval can be determined by comparing the source-drain current after the detection interval to its initial value with the gate fully charged.

In order that a charging voltage could be applied between source 11 and drain 12 and, correspondingly, that the change in the gate 13 potential (charge) could be measured as explained above, source 11 and drain 12 are connected by means of conductors 26 and 27 to connectors 28 and 29, mounted in the wall of the casing 21.

Figure 2:
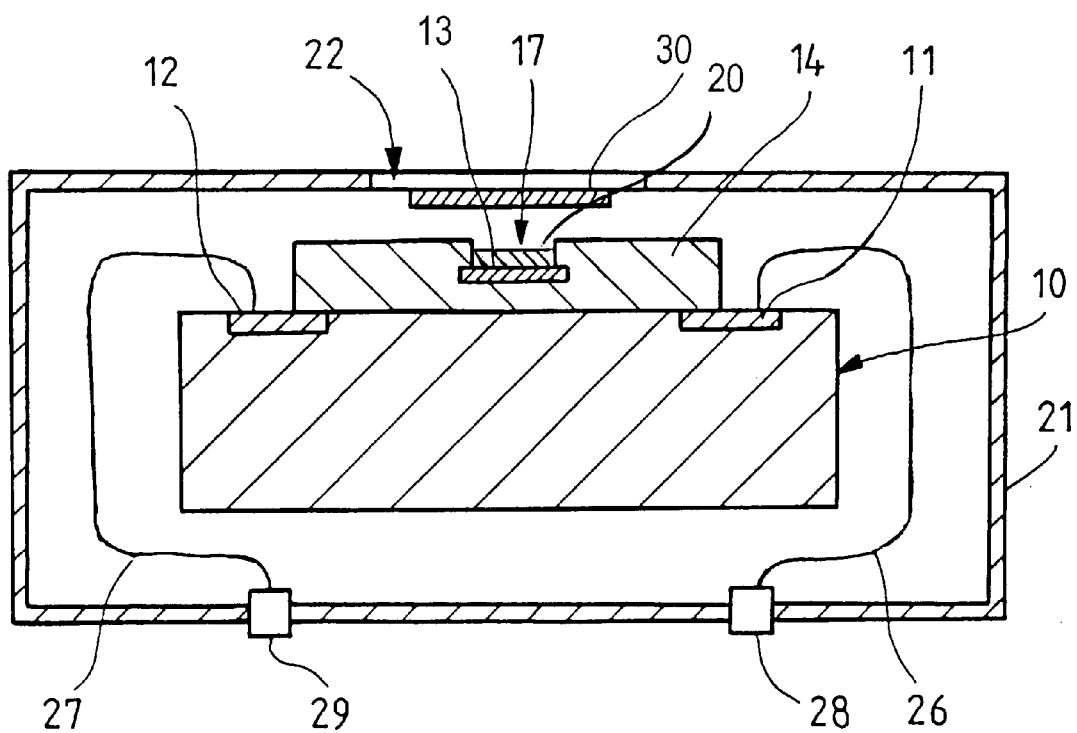
FIG. 2 shows an alternative embodiment.

According to another embodiment of the invention shown in FIG. 2 the photoemissive surface 20 is processed directly on the gate 13 which, in this case, is charged negatively before measurement. The liberated photoelectrons are collected to a separate anode 30 or just to the metal wall 21 of the casing. This causes an increase in the gate potential, the increase being indicative of the amount of light received by the detector. This is determined by measuring conductivity of the source-drain channel as above.

It is noteworthy that during the light detection (i.e. photoelectron collection) phase, the presented photodetector does not require any electrical power (voltage). However, it is naturally possible to provide an additional electric potential between the photoemissive surface and the floating gate or between the photoemissive surface and the anode, in order to enhance and optimize photoelectron collection.

We claim:

1. A photodetector comprising:

a photoemissive surface capable of emitting electrons in response to light photons to be detected, a MOSFET having a floating gate, said floating gate to be provided with a charge in such a way that emission of said electrons can cause a change in said charge, and a casing which encloses said photoemissive surface and said MOSFET, at least a portion of said casing being transparent to light in such a way that said light can reach said photoemissive surface.

2. The photodetector according to claim 1, wherein said photoemissive surface is not in contact with said floating gate and said charge is positive.

3. The photodetector according to claim 1, wherein said photoemissive surface is in contact with said floating gate and said charge is negative.

4. The photodetector according to claim 3, further comprising a means for collecting said electrons.

5. A photodetector comprising:

a photoemissive surface capable of emitting electrons in response to light photons to be detected, a MOSFET having a floating gate not in contact with said photoemissive surface, said floating gate to be provided with a positive charge, said floating gate thereby being capable of collecting said electrons, and a casing which encloses said photoemissive surface and said MOSFET, at least a portion of said casing being transparent to light in such a way that said light can reach said photoemissive surface.

6. The photodetector according to claim 5, wherein said photoemissive surface is processed on the interior surface of said transparent portion of said casing.

7. The photodetector according to claim 5, further comprising a means for registering a change in said charge, the change being caused by said electrons, the change thereby being indicative the amount of light received by the photodetector.

8. A photodetector comprising:

a photoemissive surface capable of emitting electrons in response to light photons to be detected, a MOSFET having a floating gate in contact with said photoemissive surface, said floating gate to be provided with a negative charge, and a casing which encloses said photoemissive surface and said MOSFET, at least a portion of said casing being transparent to light in such a way that said light can reach said photoemissive surface.

9. The photodetector according to claim 8, further comprising a means for registering a change in said charge, the change being caused by said electrons, the change thereby being indicative to the amount of light received by the photodetector.

10. A method for detecting light comprising the steps of:

providing a photodetector comprising: a photoemissive surface capable of emitting electrons in response to light photons to be detected, a MOSFET having a floating gate, and a casing which encloses said photoemissive surface and said MOSFET, at least a portion of said casing being transparent to light in such a way that said light can reach said photoemissive surface, charging said floating gate to a preselected potential, allowing the light to be detected to affect said photoemissive surface, thereby enabling electrons to be emitted from the photoemissive surface and causing a change in said preselected potential of said floating gate, and after a selected time registering the change in said preselected potential, said change being indicative of the amount of light received by said photodetector.

11. The method for detecting light according to claim 10, wherein the step of charging is performed by applying a voltage between the source electrode and the drain electrode of said MOSFET.

12. A method for detecting light comprising the steps of:

providing a photodetector comprising: a photoemissive surface capable of emitting electrons in response to light photons to be detected, a MOSFET having a floating gate, said floating gate having a charge thereon, and a casing which encloses said photoemissive surface and said MOSFET, at least a portion of said casing being transparent to light in such a way that said light can reach said photoemissive surface, allowing the light to be detected to affect said photoemissive surface, thereby enabling the electrons emitted from the photoemissive surface to cause a change in said charge, and after a selected time registering the change in said charge, said change being indicative of the amount of light received by said photodetector.

* * * * *